(12) United States Patent
Gerhard et al.

(10) Patent No.: US 7,130,606 B2
(45) Date of Patent: Oct. 31, 2006

(54) INTEGRATED SEMICONDUCTOR MIXER

(75) Inventors: Gregor Gerhard, Krefeld (DE); Stefan Kern, Waghaeusel (DE); Stefan Koch, Oppenweiler (DE)

(73) Assignee: Marconi Communications GmbH, Backnang (DE)

( * ) Notice: Subject to any disclaimer, the term of this patent is extended or adjusted under 35 U.S.C. 154(b) by 250 days.

(21) Appl. No.: 10/480,915

(22) PCT Filed: May 31, 2002

(86) PCT No.: PCT/EP02/06010

§ 371 (c)(1),
(2), (4) Date: Dec. 15, 2003

(87) PCT Pub. No.: WO03/005563

PCT Pub. Date: Jan. 16, 2003

(65) Prior Publication Data

US 2004/0180644 A1 Sep. 16, 2004

(30) Foreign Application Priority Data

Jun. 29, 2001 (EP) ................................ 01115902

(51) Int. Cl.
*H04B 1/10* (2006.01)
(52) U.S. Cl. .................. 455/311; 455/317; 455/333
(58) Field of Classification Search ............... 455/313, 455/318, 319, 323, 326, 327, 330, 333, 317, 455/310, 311; 327/113
See application file for complete search history.

(56) References Cited

U.S. PATENT DOCUMENTS

| | | | |
|---|---|---|---|
| 4,193,048 A * | 3/1980 | Nyhus | 333/26 |
| 5,125,111 A | 6/1992 | Trinh | |
| 6,115,594 A * | 9/2000 | Pozdeev et al. | 455/326 |
| 6,204,736 B1 * | 3/2001 | Logothetis | 333/26 |
| 6,263,198 B1 * | 7/2001 | Li | 455/327 |
| 2001/0036818 A1 * | 11/2001 | Dobrovolny | 455/326 |

FOREIGN PATENT DOCUMENTS

EP    0 769 847    4/1997

OTHER PUBLICATIONS

S. Maas: "A Broadband Planar Doubly . . . " IEEE Transactions of Microwave Theory and Techniques, Bd. 41, Nr. 12, Dec. 1, 1993, pp. 2330-2335 (In English).
J. Villemazet: "New Compact Double Balanced . . . " IEEE MTT-SB Digest. Jun. 7, 1998, pp. 853-856 (In English).

* cited by examiner

*Primary Examiner*—Nguyen T. Vo
(74) *Attorney, Agent, or Firm*—Michael J. Striker

(57) ABSTRACT

An integrated semiconductor mixer includes a substrate (10), a radio-frequency balun (12) disposed on the substrate (10), a local oscillator balun (14) disposed on the substrate (10), an intermediate-frequency port (16) disposed on the substrate (10), and a mixer diode array (18), disposed on the substrate (10), that communicates with the radio-frequency balun (12), the local oscillator balun (14), and the intermediate-frequency port (16), in which the radio-frequency balun (12) is shielded from the local oscillator balun (14) by plated holes (20).

4 Claims, 1 Drawing Sheet

INTEGRATED SEMICONDUCTOR MIXER

BACKGROUND OF THE INVENTION

The invention relates to an integrated semiconductor mixer, having a substrate, a radio-frequency balun disposed on the substrate, a local oscillator balun disposed on the substrate, an intermediate-frequency port disposed on the substrate, and a mixer array, disposed on the substrate, that communicates with the radio-frequency balun, the local oscillator balun, and the intermediate-frequency port.

Mixers of this generic type are used in radio receivers, for instance. They can be embodied as monolithic integrated microwave circuits, using microstrip technology, so that the mixer function can be made available in a very space-saving way.

Mixers can be used as upward converters and as downward converters. When mixers are used as downward converters, a signal at a high frequency (radio frequency or RF) can be converted into a signal at a lower frequency (intermediate frequency or IF). Upward converters convert an intermediate-frequency signal into a radio-frequency signal. Downward converters generate an intermediate-frequency signal by mixing the radio-frequency signal with the signal of a local oscillator (or LO). Upward converters generate the radio-frequency signal by mixing the intermediate-frequency signal with the local oscillator signal.

It is known that mixing the signals having the various frequencies leads to the formation of addition and subtraction frequencies. For instance, the intermediate frequency, as a subtraction frequency, can represent the outcome of the mixing process, which can be processed in further circuits.

Because of the short wavelength of microwaves, a microwave mixer can be embodied in a simple way on a monolithic chip with integrated circuits. For instance, it is known to embody mixers on GaAs semiconductor substrates, but integrating the mixers with further components in order to form complete upward converters and downward converters creates the necessity of shifting over to smaller and smaller mixer arrays.

A problematic aspect of component miniaturization, however, is that the various signals carried on the same substrate influence one another. For instance, there is an influence between the signals carried by the radio-frequency balun and the signal carried by the local oscillator balun. These signals of the various baluns can also influence the operation of the mixer diodes.

SUMMARY OF THE INVENTION

The invention builds upon the generic integrated semiconductor mixer by providing that the radio-frequency balun is shielded from the local oscillator balun by plated holes. By means of such plated holes, insulators that work between the regions carrying the various signals can be furnished.

In particular, it is useful that at least one row of plated holes is provided. By means of a row of plated holes, an elongated region in the semiconductor chip can be created that is adapted in its geometric shape to the radio-frequency balun or to the local oscillator balun, for instance. Thus the electromagnetic fields originating at the respective baluns can be largely shielded against.

The integrated semiconductor mixer of the invention is especially advantageously refined by providing that single-row plated holes communicate with one another by means of resistors. As a result of these resistors, unwanted regions of the electromagnetic field are suppressed or attenuated. In this way, the rows of plated holes are prevented from acting as resonators with high quality Q.

It is especially useful that a first row of plated holes is disposed in the vicinity of the radio-frequency balun, and that a second row of plated holes is disposed in the vicinity of the local oscillator balun. In this way, the electrical fields of both baluns are shielded against, thus lessening the mutual influence.

It can also be especially useful that a first row of plated holes is disposed between the radio-frequency balun and the mixer diode array, and that a second row of plated holes is disposed between the local oscillator balun and the mixer diode array. Thus the influences on the mixer diodes that are due to the electromagnetic fields transmitted by the baluns can be lessened.

The invention is based on the recognition that by furnishing plated holes that communicate with one another particularly by means of resistors and are embodied in the form of rows, the insulation between local oscillator signals and radio-frequency signals can be improved considerably, for instance up to 10 dB. The concrete disposition of the rows of plated holes is an important parameter for achieving the most effective possible insulation. In customer-specific integrated semiconductor mixers, especially good insulation can thus be furnished individually by means of the placement of the rows of plated holes.

BRIEF DESCRIPTION OF THE DRAWINGS

The invention will be described now in conjunction with the accompanying drawing, in terms of a preferred embodiment.

DETAILED DESCRIPTION OF THE PREFERRED EMBODIMENTS

Figure 1:
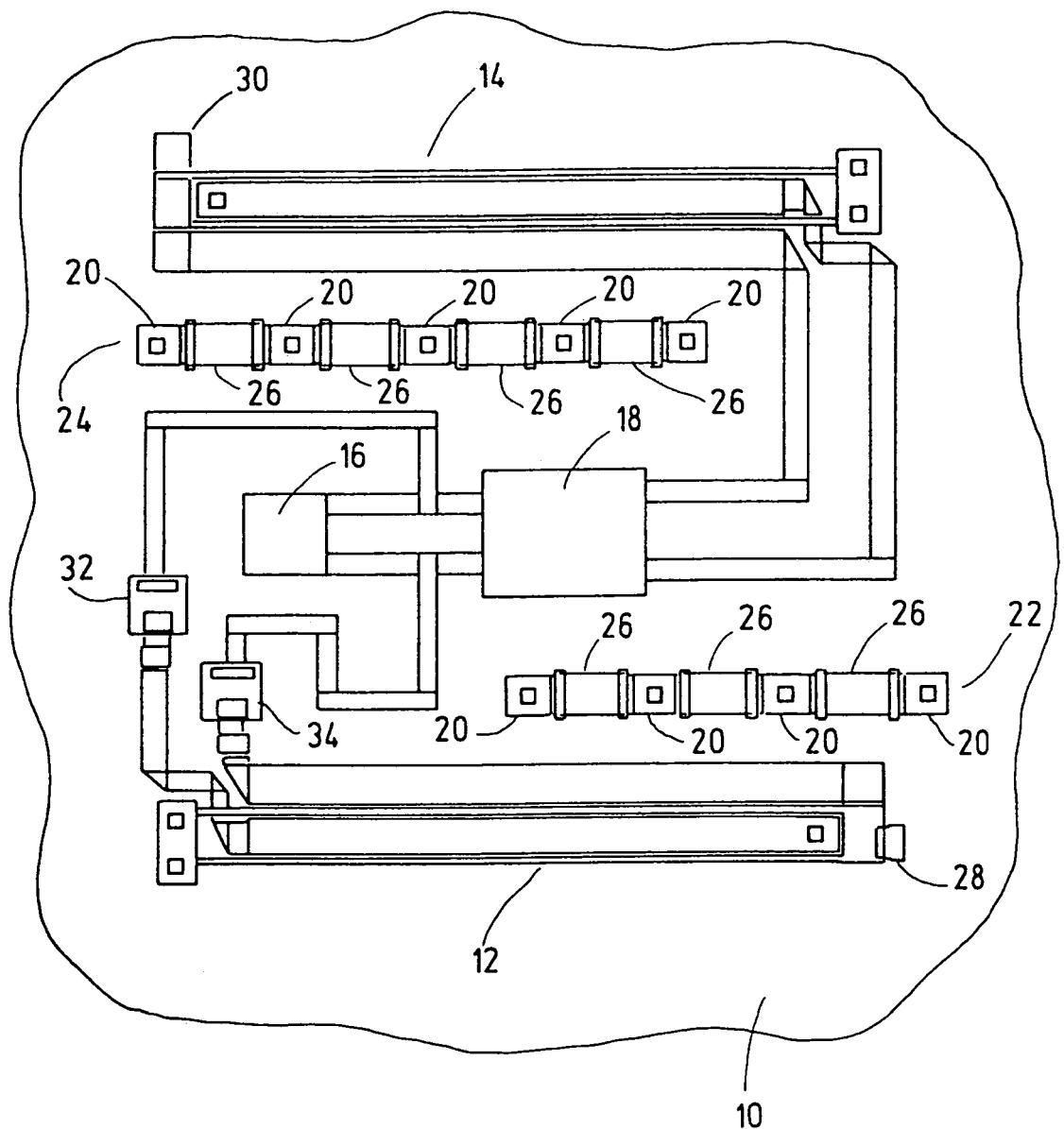
FIG. 1 shows a plan view on part of a semiconductor substrate with an integrated semiconductor mixer according to the invention.

FIG. 1 shows a plan view on a portion of a semiconductor substrate 10 with an integrated semiconductor mixer of the invention. The line arrangement shown, which is based on microstrip technology, connects various components with one another to form a double balanced mixer. The arrangement includes a radio-frequency balun 12 with a radio-frequency port 28 and a local oscillator balun 14 with a local oscillator port 30. In the center of the arrangement, mixer diodes 18 are provided. The radio-frequency balun 12 converts the unbalanced radio-frequency signal, which is input at the radio-frequency port 28, into a balanced signal, so that it can be supplied to the mixer diode structure 18 via the series capacitors 32, 34. In a comparable way, the local oscillator balun 14 converts the unbalanced local oscillator signal supplies at the local oscillator port 30 into a balanced signal, so that this balanced signal can also be delivered to the mixer diode array 18. The respective baluns 12, 14 function in such a way that signals with a phase difference of approximately 180° are generated. Thus a signal is made available that is no longer referred to ground but instead is embodied between the two lines that originate at the balun. An intermediate-frequency port 16 also communicates with the mixer diode array 18; in the case of downward conversion of the radio-frequency, this port furnishes the useful signal that is to be processed further.

Rows 22, 24 of plated holes 20 are provided in the vicinity of the respective baluns 12, 14. These rows 22, 24 of plated holes 20 are each designed such that the individual plated holes 20 communicate with one another by means of resistors 26. The plated holes 20 make an insulation of the electrical fields, generated by the local oscillator signal and the radio-frequency signal, respectively, from one another available. An insulation is also made available between the radio-frequency balun 12 and the mixer diode array 18, and between the local oscillator balun 14 and the mixer diode array 18.

The actual insulating action comes about by grounding of the plated holes 20, while the resistors serve to prevent unwanted resonance of the rows 22, 24 of plated holes.

The concrete arrangement of the rows 22, 24 of plated holes can vary, depending on the particular application. Among the peripheral conditions of the other elements of the microwave circuit, the special arrangement of the rows of plated holes can be optimized for each instance.

The above description of the exemplary embodiments of the present invention is intended solely for purposes of illustration and is not intended to limit the invention. Various changes and modifications to the invention may be made without departing from the scope of the invention or its equivalents.

The invention claimed is:

1. An integrated semiconductor mixer, comprising:
   a substrate (10);
   a radio-frequency balun (12) disposed on the substrate (10);
   a local oscillator balun (14) disposed on the substrate (10);
   an intermediate-frequency port (16) disposed on the substrate (10); and
   a mixer diode array (18), disposed on the substrate (10), that communicates with the radio-frequency balun (12), the local oscillator balun (14), and the intermediate-frequency port (16),
   wherein the radio-frequency balun (12) is shielded from the local oscillator balun (14) by plated holes (20),
   wherein single-row plated holes (20) communicate with one another by means of resistors (26).

2. The integrated semiconductor mixer of claim 1, wherein at least one row (22, 24) of plated holes (20) is provided.

3. The integrated semiconductor mixer of claim 1, wherein a first row (22) of plated holes (20) is disposed in the vicinity of the radio-frequency balun (12), and wherein a second row (24) of plated holes (20) is disposed in the vicinity of the local oscillator balun (14).

4. An integrated semiconductor mixer, comprising:
   a substrate (10);
   a radio-frequency balun (12) disposed on the substrate (10);
   a local oscillator balun (14) disposed on the substrate (10);
   an intermediate-frequency port (16) disposed on the substrate (10); and
   a mixer diode array (18), disposed on the substrate (10), that communicates with the radio-frequency balun (12), the local oscillator balun (14), and the intermediate-frequency port (16),
   wherein the radio-frequency (12) is shielded from the local oscillator balun (14) by plated holes (20),
   wherein a first row (22) of plated holes (20) is disposed between the radio-frequency balun (12) and the mixer diode array (18), and
   wherein a second row (24) of plated holes (20) is disposed between the local oscillator balun (14) and the mixer diode array (18).

* * * * *

UNITED STATES PATENT AND TRADEMARK OFFICE
CERTIFICATE OF CORRECTION

PATENT NO. : 7,130,606 B2 Page 1 of 1
APPLICATION NO. : 10/480915
DATED : October 31, 2006
INVENTOR(S) : Gerhard et al.

It is certified that error appears in the above-identified patent and that said Letters Patent is hereby corrected as shown below:

In Column 4, Line 26, in Claim 4, after "radio-frequency" insert -- balun --.

Signed and Sealed this

Thirtieth Day of December, 2008

JON W. DUDAS
*Director of the United States Patent and Trademark Office*